United States Patent [19]

Campbell

[11] 4,306,695

[45] Dec. 22, 1981

[54] NON-LINEAR FILTER

[75] Inventor: Richard D. Campbell, Swissvale, Pa.

[73] Assignee: American Standard Inc., Swissvale, Pa.

[21] Appl. No.: 55,590

[22] Filed: Jul. 9, 1979

[51] Int. Cl.$^3$ .................. B61L 25/02; H03H 11/12
[52] U.S. Cl. ........................ 246/182 BH; 328/167; 330/141
[58] Field of Search ..... 246/182 B, 182 AA, 182 AB, 246/187 C, 182 BH; 307/294, 228, 351; 333/20, 172; 330/141, 281; 455/244; 328/167

[56] References Cited

U.S. PATENT DOCUMENTS

| | | | |
|---|---|---|---|
| 2,111,386 | 3/1938 | Buchmann et al. | 330/141 X |
| 2,556,070 | 6/1951 | De Groot et al. | 330/141 |
| 3,305,801 | 2/1967 | Hartenstein | 333/172 X |
| 3,524,081 | 8/1970 | Campanella | 328/167 X |
| 3,600,639 | 8/1971 | Grange et al. | 307/294 X |
| 3,755,750 | 8/1973 | Heberling | 328/167 |
| 3,848,142 | 11/1974 | Adachi | 307/294 |
| 4,048,521 | 9/1977 | Thompson et al. | 307/291 |
| 4,054,804 | 10/1977 | Tanaka | 307/294 X |
| 4,219,745 | 8/1980 | Hersman | 328/167 X |

*Primary Examiner*—Paul L. Gensler
*Attorney, Agent, or Firm*—A. G. Williamson, Jr.

[57] ABSTRACT

A non-linear filter which reduces high signal-to-noise ratio due to sharp and erratic variations in an input signal by charging a storage capacitor through a long time constant charging circuit so that the stored signal level lags an increasing input. A parallel path with a much lower time constant rapidly discharges the capacitor upon input decreases, so that the stored signal matches the more accurate lower input signal level. A practical application is for car space measurements in railroad yard storage tracks to substantially reduce erratic distance measurements due to poor shunting under moving cars. The distance measurement signal is applied through an integrator network to a first of four FET operational amplifiers, whose input and feedback networks have selected time constants to substantially filter out background noise due to the track signal frequency. The second amplifier provides a perfect rectifier for the discharge of the storage capacitor through a low time constant path when the input signal decreases. A T-shaped resistor network and the third amplifier provide longer time constants to delay the charging of the storage capacitor, in accordance with an increasing output level from the first amplifier, without requiring excessively large component values. A final amplifier provides a representative distance measurement signal output from the storage capacitor from which noise due to poor shunting by a moving car is largely eliminated for increased accuracy.

11 Claims, 2 Drawing Figures

NON-LINEAR FILTER

BACKGROUND OF THE INVENTION

My invention pertains to a non-linear filter circuit arrangement. More specifically, the invention pertains to a non-linear filter circuit arrangement for use in car space measurement systems in railroad classification yards to reduce the signal-to-noise ratio and thus overcome measurement errors due to poor shunting by cars moving along the various storage tracks.

In railroad classification yards, various electrical arrangements are used to measure the unoccupied space in each classification or storage track. This car space measurement, also called distance-to-go, is used as one factor in calculating the desired departure speed for controlling the various car retarders which establish the speed of the moving cars entering the classification tracks. Most of these measuring arrangements use a selected characteristic of rail current, which flows in a rail loop from the entry end of each storage track to the nearest car axle shunt, to determine the distance to the shunt, i.e., the remaining storage space. Fairly accurate measurements are obtained when cars are not in motion, but the data signal becomes very noisy when a car is moving along the track. This noise is caused by the poor shunting of a single car so that the shunt is sometimes through the rear truck of the car, sometimes through the front truck, and sometimes through neither. The noise depends strongly on the electrical conductivity of the rail surface and becomes very bad when the rail is quite rusty. Even under rusty rail conditions, there are occasional instances of good shunting. If a car has been acting as a poor shunt, then the occurrence of a good shunt will cause the car to appear to have moved backwards along the track. This apparent reverse movement is indicated since the signal being measured across the track at the entry end changes suddenly from a relatively high level to a low or minimum level, which then usually disappears and a high level reading is again received. Actually, the intermittent low readings are correct values of the instant distance measurement and the intervening and erratic larger readings are entirely meaningless. It is important, of course, to know that a car is still moving along the storage track toward the standing cars and to have some relatively accurate indication of its increasing distance down the track, so that the speed control of following cars directed to that track may be more efficiently controlled. Thus, some means to substantially reduce the effect of the noise level in the track measurements, in order to provide a more accurate distance measurement and thus more accurate speed control of the cars moving to coupling, is a desirable feature for classification yard control systems.

Accordingly, an object of my invention is a filter circuit arrangement having a non-linear response to input signal increases and decreases.

Another object of the invention is a non-linear filter circuit in which the output signal lags increases of the input signal level, but follows more closely as the input decreases.

A further object of my invention is a filter arrangement to improve the measurement of the distance to a moving shunt in a transmission channel when poor shunting conditions exist.

Another object of the invention is a non-linear filter arrangement for track distance measuring apparatus to reduce the effect of noise in rail current due to poor shunting by cars moving along the track.

A still further object of my invention is a non-linear filter to reduce noise due to erratic increases and decreases in an input voltage signal, the filter including a capacitor with a charging circuit having a relatively large time constant and a discharge circuit with a very much shorter time constant so as to reduce the output signal variations when the input increases, but to rapidly correct when the input decreases.

Still another object of the invention is a non-linear filter arrangement for reducing noise in distance measurement signals in a railroad yard due to intermittent and poor shunting of the track rails by cars moving along a storage track.

A yet further object of the invention is a filter arrangement for car space measuring apparatus in railroad yards to reduce the effect of poor shunting by moving cars by delaying increase in the distance signal storage when a rapid input level increase occurs due to loss of shunt and for rapidly varying the stored signal when the input decreases upon the renewal of the shunt to improve the accuracy of a continuously varying distance signal as a car travels along the track.

Other objects, features, and advantages of the invention will become apparent from the following specification and appended claims when taken in connection with the accompanying drawings.

SUMMARY OF THE INVENTION

According to the basic concept of the invention, the filter network is supplied with an input signal which represents a parameter measurement which is subject to sharp, erratic changes. This input signal is registered in a storage means having an input delay factor which slows the registration of measurement increases as the input signal level rapidly increases due to poor measurement conditions. When the input signal level decreases as the measurement signal decreases to a more accurate level as a result of better measuring conditions, the storage means rapidly reduces the stored signal through a network having a much smaller delay factor. This achieves a more accurate average reading and reduces the average level of the higher, incorrect readings. In the specifically illustrated circuit for this basic concept, a capacitor is charged through a diode and resistor circuit path by an input voltage signal representative of the measured parameter. The diode is so poled that the input signal is applied to the capacitor only when larger than the existing signal storage, that is, when the input is increasing. However, the resistor value is selected to provide a relatively large time constant so that the signal level stored in the capacitor lags the input signal as increases occur. Thus, sharp, rapid input increases due to intermittent poor parameter measuring conditions, e.g., lost shunting under moving cars in a railroad track, are stored only after a delay time. A distinct, separate discharge circuit, including a lower value resistor and an oppositely poled diode, couples the capacitor to the input terminals with a very much smaller time constant so that the capacitor discharges rapidly when the input signal decreases. The output signal level across the capacitor, when steady, thus represents a constant parameter measurement, e.g., the distance to a standing car or the space-available factor in a track. In this specific use, a gradual increase in the average output signal represents the increasing distance to a moving car.

When a loss of shunt under this car causes a much higher input level with a sharp change or rise, the registry of the longer distance is delayed by the slow charging time. When a shunt is again effective to reduce the input signal level, the capacitor is caused to rapidly discharge to match this reduction. This produces a quick change to the actual distance measurement registry which can be interpreted as a moving car since the general slope of the distance curve is in an upward or rising direction.

In a practical application to measure the remaining available space or distance-to-go in classification yard storage tracks, the disclosed apparatus utilizes the principle discussed, but with an expanded circuit arrangement including four operational amplifier networks based on field effect transistors (FET). A first amplifier network receives the input signal from the track through an integrating capacitor network. A separate capacitor feedback path cooperates with this input network so that the amplifier network acts as a linear filter to remove background noise resulting from the frequency of the actual rail current used for the distance measurement. The output from this first amplifier becomes a charging voltage for a storage capacitor functioning similarly to that previously discussed with the basic concept. This storage capacitor has separate charge and discharge circuit networks having different time constants. These are controlled by second and third operational amplifier networks so that the storage capacitor charges as the input signal from the track increases but with the total stored voltage lagging behind increases in the track signal. Similarly, the discharge circuit with its much lower time constant is completed by one of the operational amplifiers acting as a rectifier to rapidly remove the charge level as the input signal decreases. A fourth operational amplifier provides an output signal path for repeating the instant voltage stored on the storage capacitor to provide a signal representing the remaining space available in a particular storage track.

BRIEF DESCRIPTION OF THE DRAWINGS

Before defining my invention in the appended claims, I will describe in more detail specific circuits disclosing the basic operating principle and a practical arrangement for railroad yards as illustrated in the accompanying drawings in which:

In each of the drawing figures, similar reference characters designate similar parts of the apparatus. Further, where specific details are not important, appropriate conventional logic symbols are used in these drawings to illustrate circuit elements.

DESCRIPTION OF THE ILLUSTRATED EMBODIMENT

Figure 1:
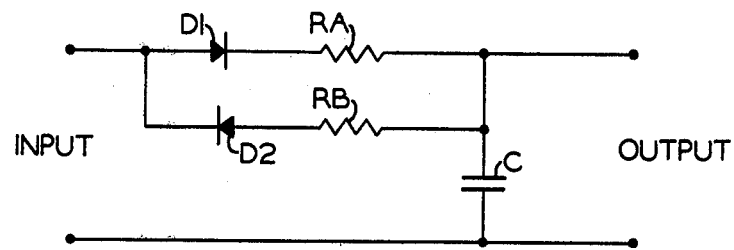
FIG. 1 is a circuit diagram of a non-linear filter illustrating the basic operation by which the principle embodied in the invention may be explained.

Referring first to FIG. 1, a basic non-linear filter circuit is shown which can improve the signal-to-noise ratio in, and thus the accuracy of, a signal representing a parameter measurement, where the filter input signal represents the actual measurement which is subject to large erratic and rapid changes or fluctuations due to inherent uncontrollable characteristics in the measurement method. A specific example is a measurement of the distance from the entry end of a railroad yard storage track to the nearest car, particularly a moving car. In general, alternating current is supplied across the rails at the entry end of the storage track and flows through the loop circuit comprising the rails to the nearest car wheel-axle shunt. The input signal to the filter is then the voltage measured across the rails at the entry end. When the car is still moving to couple with previously standing cars, the rail shunt location varies in a manner previously discussed, causing rapid and erratic changes in the voltage measurement. It is to be noted that these fluctuations in the voltage measurement are one-sided, that is, are always to or from an indicated measurement of a greater distance than the actual instant distance to the moving car. Determination of the actual distance may be made directly from the impedance of the rail circuit, as indicated by the voltage drop across the rail loop, or may be calculated from the phase shift caused by the rail loop circuit. The arrangement of my invention may be applied to either of these conventional distance determining arrangements, and to others which are known. In other words, the purpose of my invention is only to improve the signal-to-noise ratio of the measurement signal, i.e., the filter output, applied to the apparatus which determines the actual value of the parameter being measured, and there is little or no involvement with the specific arrangement which determines this actual parameter, for example, the remaining car space or distance-to-go.

For purposes of analysis and description of the basic circuit shown in FIG. 1, the diodes D1 and D2 are assumed to be perfect rectifiers and resistance RA is designated as being much larger than resistance RB. The output of the filter circuit is, of course, obviously determined by the voltage or charge stored on capacitor C across which the output terminals are connected. When the input signal is increasing, the input signal also increases but at a slower rate. This is controlled by the charging of capacitor C through the diode D1, resistor RA circuit path having the time constant RA(C). For example, in the track distance measurement field, the input signal increases quite sharply when the car shunt in the track is lost or shifts to a forward axle of the moving car. When the input signal decreases (car rear axle shunt restored), capacitor C discharges through resistor RB and diode D2, with the circuit time constant being RB(C). Since this second time constant is very much less than the first-mentioned time constant, resistor RB being much smaller than resistor RA, capacitor C discharges rather rapidly to equal the input signal level, which is now a more accurate measurement of the distance along the track. One practical ratio of the time constants which may be used is approximately 30 to 1, e.g., RA(C) equal to 2.0 seconds while RB(C) is equal to 0.07 second. In a practical experiment, a filter network with this ratio and parameters gave considerable improvement in the distance measurement data for a moving car providing a good shunting condition only 3% of the time.

Figure 2:
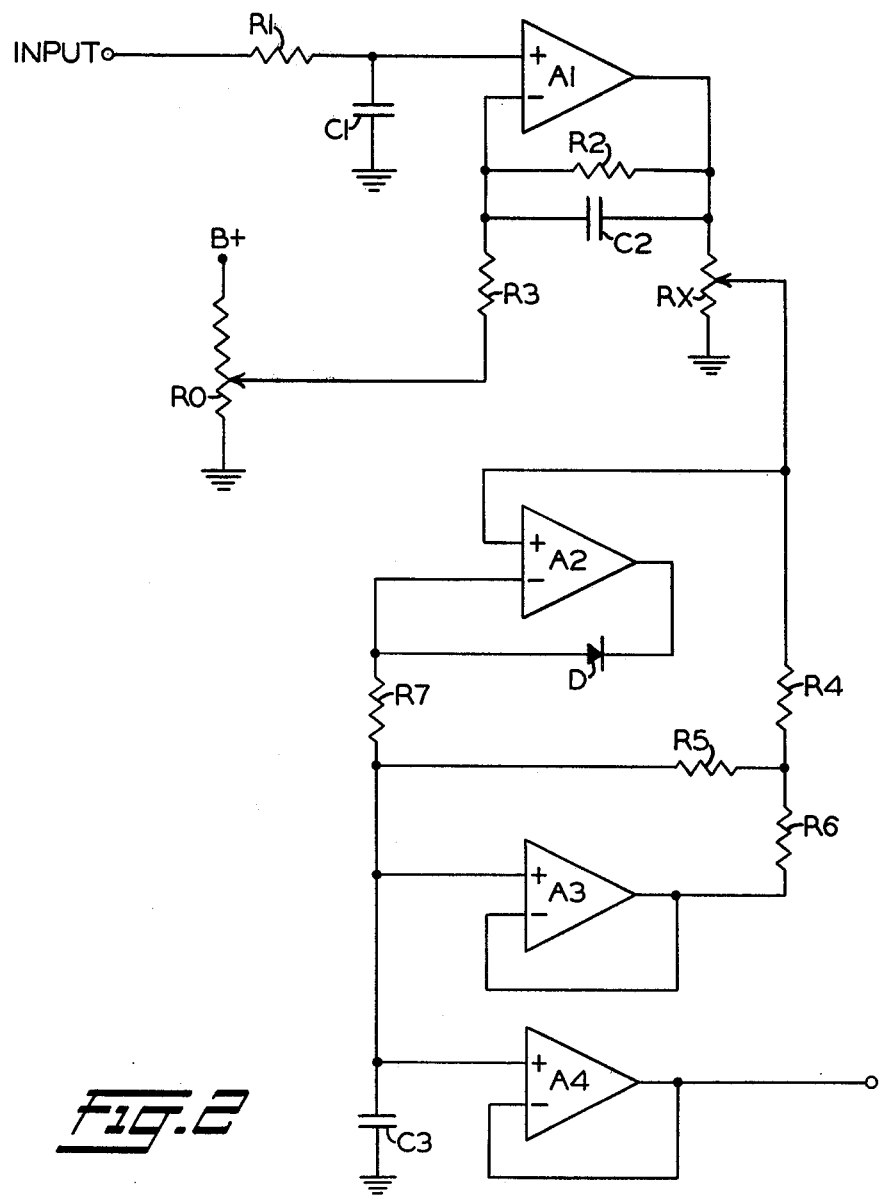
FIG. 2 is a diagrammatic illustration of a non-linear filter arrangement for use specifically in a track distance measuring circuit arrangement for railroad classification yards and which embodies the invention.

A practical implementation of the basic filter is shown in the circuit arrangement of FIG. 2. This arrangement was specifically designed for use in the measurement of the car space remaining in the individual storage tracks of a railroad classification yard. The filter of FIG. 2 is built around the storage capacitor C3 and four FET input operational amplifiers, each shown by conventional symbol designated A with a distinguishing numerical suffix. The use of this type of operational amplifier allows the use of high impedances in the feedback networks. The specific purpose and coupling of each amplifier is discussed in the following paragraphs.

Amplifier A1 provides input linear filtering and gain. The input signal from the track, i.e., the raw distance measurement, is applied to the positive (+) input terminal of amplifier A1 through an integrating network comprising resistor R1 and capacitor C1. A zero adjustment voltage is supplied to the negative (−) input of amplifier A1 through resistor R3 from the potentiometer R0 connected between the B+ terminal of a suitable direct current source and a ground terminal shown by conventional symbol, the zero adjustment being provided by the variable tap on resistor R0. The output from this amplifier appears across gain control potentiometer RX which is connected from the output terminal to ground and provides a gain adjustment for the remainder of the non-linear filter circuit arrangement. Amplifier A1 is provided with a feedback network comprising the parallel circuit paths through resistor R2 and capacitor C2. This results in a gain for the amplifier equal to R2/R3. The actual values of resistors R1 and R2 and capacitors C1 and C2 are selected so that the time constants R1(C1) and R2(C2) provide filtering to remove background noise, e.g., ripple, in the input signal originating from the source used for distance measuring. For example, in one intended application, the background noise has the frequency of 60 Hz since the applied track energy is from the commercial power source, the actual distance measurement being proportional to the phase angle displacement through the rail loop. This filtering is desirable although not critical to the non-linear operation of the whole arrangement.

Amplifier A2 functions as a perfect rectifier for the discharge of storage capacitor C3 through resistor R7 so that the time constant for charge removal is then R7(C3). This discharge path is connected between the (−) terminal of amplifier A2 and ground, while a selected portion of the output signal of amplifier A1 is applied to the (+) terminal of amplifier A2. The simple feedback path for the amplifier includes diode D. Amplifier A2 is activated to discharge capacitor C3 when the output of amplifier A1 is decreasing, i.e., when the input signal from the track decreases as the shunt distance measurement is restored to the rear axle of a moving car.

The next amplifier A3 functions to provide a time constant for adding charge to storage capacitor C3 when the output from amplifier A1 increases as a result of the track signal increasing. The (+) terminal of amplifier A3 is connected to the upper plate of capacitor C3 at the junction point between this capacitor and resistor R7 while the (−) terminal is connected by a direct feedback circuit to the output terminal. A T-shaped circuit network including resistors R4, R5, and R6 is connected between the tap on gain control resistor RX, the output terminal of amplifier A3, and the upper plate of capacitor C3 for the purpose now described. If it is initially assumed that the value of resistor R4 is zero (0) and if resistor R6 is infinite, the time constant for adding charge to capacitor C3 is then R5(C3). However, if resistors R4 and R6 have equal value and both are small compared with resistor R5, then the potential at the junction of the three resistors is midway between the output potential of amplifier A3 and the input voltage from resistor RX. However, since amplifier A3 is a voltage follower, its output is equal to the voltage stored on capacitor C3. Thus the voltage potential at the junction of the resistors is halfway between the charge on capacitor C3 and the voltage at the tap on resistor RX so that the current through resistor R5 is exactly half of the value that it was when resistor R4 is zero (0) and resistor R6 has an infinite value, the initial assumption. The time constant in this latter or second situation is then 2R5(C3). In other words, in general terms, the time constant for charging capacitor C3 is:

$$R4+R6/R6 \cdot R5(C3)$$

If desired, larger time constants may obviously be obtained by increasing the value of resistor R4, by decreasing the value of resistor R6, or by taking both actions. Thus, large time constants are possible without the necessity of using large value components, i.e., capacitor C3 and resistor R5.

The final amplifier A4 is merely another voltage follower supplying an independent output from the non-linear filter arrangement equal to the existing voltage stored on capacitor C3. This output voltage signal is then supplied to the apparatus which determines the actual distance measurement.

The arrangement of my invention thus provides a non-linear filter arrangement which supplies an output signal having an improved signal-to-noise ratio even though the input is characterized by erratic and sharp increases and decreases in signal level. Specifically, the invention arrangement provides a non-linear filter by which more accurate car space or distance-to-go measurements for a yard storage track may be provided for use in a classification yard speed control system. Elaborating on the basic concept, practical apparatus is supplied which will function under the specific conditions in a conventional railroad yard. This apparatus uses conventional solid-state circuits readily available in the market. It is adaptable to all well known methods of determining distance measurements in storage tracks. Although shown for this specific use, other comparable applications are possible with a minimum of redesign. The non-linear filter is thus an effective and efficient means for substantially reducing high noise-to-signal ratio where the noise level is particularly erratic and is one-sided.

Although I have herein shown and described but a basic and one practical non-linear filter circuit arrangement embodying my invention, it is to be understood that various changes and modifications therein within the scope of the appended claims may be made without departing from the spirit and scope of my invention.

Having now described the invention, what I claim as new and desire to secure by Letters Patent, is:

1. A non-linear filter arrangement comprising;
 (a) a capacitor for storing voltage signals,
 (b) a source of input signals for supplying said filter arrangement,
 (c) a first operational amplifier network coupled for receiving said input signals and operable for supplying an output of equivalent signals at a predetermined gain,
 (d) a charging circuit means coupled between said capacitor and said first amplifier network and including a first selected resistance for at times charging said capacitor with a first preselected time constant so that the charge on said capacitor lags an increase in said equivalent signals by a first predetermined delay time established by said first time constant, (e) a discharge circuit means also coupled between said capacitor and said first amplifier network and including a second resistance for at times discharging said capacitor with a second preselected time constant, substantially smaller than said first time constant, so that the instantaneous charge on said capacitor substantially matches a decrease in said equivalent signals, (f) a second operational amplifier network coupled into said discharge circuit means and responsive to said equivalent signals for activating discharge of said capacitor through said discharge circuit means only when the level of said equivalent signals is less than the existing signal level stored on said capacitor, (g) a third operational amplifier network coupled into said charging circuit means and responsive to said equivalent signals for activating charging of said capacitor through said charging circuit means only when the level of said equivalent signals is greater than the existing signal level stored on said capacitor, and (h) an output circuit means coupled to said capacitor for providing an output signal which has the voltage level of the existing stored signal and thus lags an input signal of increasing level and substantially matches an input signal of decreasing level to reduce, in the output signal, a large signal-to-noise ratio resulting from an input signal erratically varying about said stored voltage level.

2. A filter arrangement, as defined in claim 1, in which, (a) said third amplifier is connected as a voltage follower with one input coupled to said capacitor to receive the existing stored signal, (b) said first selected resistance associated with said third amplifier comprises three resistors connected in a T-shaped network,
 (1) a first and second resistor of that network connected in series between the outputs of said first and third amplifiers,
 (2) a third resistor of that network connected between the junction of said first and second resistors and said capacitor for at times forming said capacitor charging circuit having said first time constant, (c) said charging circuit is responsive to the condition of said third amplifier network for adding to the capacitor charge level only when the output of said third amplifier reflects that the existing stored signal is less than said equivalent signals.

3. A filter arrangement, as defined in claim 1 or 2, in which, said output circuit is a fourth operational amplifier connected as a voltage follower and coupled for producing a varying output signal in accordance with the existing signal stored on said capacitor.

4. A non-linear filter circuit arrangement, for use in car space measurements in railroad yard storage tracks, through which cars move from an entry end to coupling with previously stored standing cars, comprising in combination, (a) a first operational amplifier and filter network means coupled for receiving an input voltage signal representing the instant distance measurement from the entry end of a particular storage track to the nearest car shunt, said input signal varying as a car moves along said particular track,
 (1) said first amplifier-filter network means responsive to said input signal for producing a corresponding output signal at a preselected gain and from which measurement source noise is substantially removed, (b) a signal storage means with first and second delay circuits for entry and removal of signal storage, respectively, the second circuit predetermined delay period being substantially less than the first circuit predetermined delay period, (c) a second operational amplifier network coupled for removing signal storage from said storage means through said second delay circuit when said second amplifier is activated, (d) a third operational amplifier network coupled for adding signal storage to said storage means through said first delay circuit after the corresponding predetermined time delay when said third amplifier is activated, (e) said third and second amplifier networks coupled to said first amplifier network to be separately activated as said first amplifier output is increasing or decreasing, respectively, from the existing signal stored in said storage means, and (f) an output means coupled for supplying a distance measurement signal from said storage means, in accordance with the existing stored signal, in which erratic variations due to a moving car are substantially reduced.

5. A filter circuit arrangement, as defined in claim 4, in which, (a) said signal storage means is a capacitor coupled to the input of said third amplifier, (b) said first delay circuit is a charging circuit for said capacitor having a first preselected time constant and controlled by said third amplifier for adding to the signal stored in said capacitor after said first delay period only when the first amplifier output increases, (c) said second delay circuit is a discharge circuit for said capacitor having a second preselected and substantially smaller time constant and controlled by said second amplifier for rapidly reducing the signal stored in said capacitor only when said first amplifier output decreases.

6. A filter circuit arrangement, as defined in claim 5, in which said capacitor charging circuit comprises, (a) a first and a second resistor connected in series between said first amplifier output and the third amplifier output, (b) a third resistor connected between the junction of said first and second resistors and the third amplifier input, (c) said third resistor having a resistance value substantially greater than said first and second resistors, whereby said first time constant may be substantially varied by a small change in the ratio of resistance values of said first and second resistors.

7. A filter circuit arrangement, as defined in claim 5 or 6, in which, said output means is a fourth operational amplifier connected as a voltage follower and coupled for producing a varying output signal in accordance with the existing signal stored on said capacitor.

8. A filter circuit arrangement having a selected delay time between input and output signals upon a sharp increase of the input signal comprising, (a) a voltage follower amplifier means having an input, and an output connected to said filter output, (b) a T-shaped resistance network coupled between said filter input and said amplifier input and output for supplying to said amplifier input a predetermined portion of the voltage potential between said filter input and said amplifier output, and (c) a capacitor coupled to said amplifier input for receiving a charge in accordance with the voltage signal at said amplifier input for delaying the response of said amplifier to an input signal increase in accordance with the effective time constant associated with said capacitor, (1) said effective time constant being proportional to the product of the resistance between the filter and amplifier inputs multiplied by a ratio of the separate resistances between said filter input and amplifier output.

9. A filter circuit arrangement, as defined in claim 8, in which said T-shaped resistance network comprises, (a) a first and a second resistor connected in series between said filter input and said amplifier output, (b) a third resistor connected between the junction of said first and second resistors and said amplifier input for providing a charging circuit for said capacitor having a time constant variable over a substantial range by small variations in the values of said first and second resistors.

10. A filter circuit arrangement, as defined in claim 8, in which said T-shaped resistance network comprises, (a) a first and a second resistor connected in series between said filter input and said amplifier output, (b) a third resistor connected between the junction of said first and second resistors and said amplifier input for providing a charging circuit for said capacitor having a time constant proportional to the sum of said first and second resistors divided by said second resistor.

11. A filter circuit arrangement, as defined in claim 8, in which said T-shaped resistance network comprises, (a) a first and a second resistor connected in series between said filter input and said amplifier output, (b) a third resistor connected between the junction of said first and second resistors and said amplifier input for providing a charging circuit for said capacitor having a time constant determined by:

$$1R + 2R/2R \cdot 3R(C)$$

where:
  1R is value of first resistor
  2R is value of second resistor
  3R is value of third resistor
  C is value of capacitor.

* * * * *